United States Patent
Nakamura

(10) Patent No.: US 8,077,525 B2
(45) Date of Patent: Dec. 13, 2011

(54) NONVOLATILE SEMICONDUCTOR MEMORY DEVICE

(75) Inventor: Dai Nakamura, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 228 days.

(21) Appl. No.: 12/537,549

(22) Filed: Aug. 7, 2009

(65) Prior Publication Data

US 2010/0067300 A1 Mar. 18, 2010

(30) Foreign Application Priority Data

Sep. 17, 2008 (JP) .................................. 2008-238266

(51) Int. Cl.
*G11C 11/34* (2006.01)
(52) U.S. Cl. .......... 365/185.29; 365/185.18; 365/185.25
(58) Field of Classification Search ............. 365/185.29, 365/185.25, 185.18; 355/185.18
See application file for complete search history.

(56) References Cited

U.S. PATENT DOCUMENTS

| | | | | |
|---|---|---|---|---|
| 6,477,088 B2* | 11/2002 | Ogura et al. | ............. | 365/185.29 |
| 6,967,874 B2* | 11/2005 | Hosono | ..................... | 365/185.33 |
| 2008/0181019 A1* | 7/2008 | Shibata | ..................... | 365/185.25 |

FOREIGN PATENT DOCUMENTS

| | | |
|---|---|---|
| JP | 2005-25824 | 1/2005 |
| JP | 2005-25891 | 1/2005 |
| JP | 2006-252624 | 9/2006 |
| JP | 2007-250187 | 9/2007 |

OTHER PUBLICATIONS

Decision of Refusal issued Mar. 8, 2011, in Japanese Patent Application No. 2008-238266 (with English translation).
Office Action issued Nov. 9, 2010, in Japan Patent Application No. 2008-238266 (with English translation).

* cited by examiner

*Primary Examiner* — Son Dinh
(74) *Attorney, Agent, or Firm* — Oblon, Spivak, McClelland, Maier & Neustadt, L.L.P.

(57) ABSTRACT

A nonvolatile semiconductor memory device includes: a memory cell array configured to have a plurality of blocks arranged thereon, each of the blocks being configured by an assembly of NAND cell units, each of the NAND cell units including a plurality of nonvolatile memory cells connected in series and word lines configured to commonly connect control gates of the memory cells. A data erase operation is executed by first applying a pre-charge voltage to the word lines, then setting to a floating state the word lines in a non-selected block where erasure of data is not to be executed, applying a certain voltage to the word lines in a selected block where erasure of data is to be executed and applying an erase voltage to a well where the memory cell array is formed, thereby altering a threshold voltage of the memory cells in the selected block.

20 Claims, 12 Drawing Sheets

NONVOLATILE SEMICONDUCTOR MEMORY DEVICE

CROSS REFERENCE TO RELATED APPLICATIONS

This application is based on and claims the benefit of priority from prior Japanese Patent Application No. 2008-238266, filed on Sep. 17, 2008, the entire contents of which are incorporated herein by reference.

BACKGROUND OF THE INVENTION

1. Field of the Invention

The present invention relates to a semiconductor memory device (EEPROM) configured using electrically rewritable nonvolatile memory cells.

2. Description of the Related Art

Known as a nonvolatile semiconductor memory device that is electrically rewritable and enables a high level of integration (EEPROM) is a NAND flash memory. In a NAND flash memory, a NAND cell unit is configured by connecting in series a plurality of memory cells in a manner that neighboring cells share a source/drain diffusion layer. The two ends of the NAND cell unit are connected to a bit line and a source line, respectively, via select gate transistors. This kind of NAND cell unit configuration enables reduction in unit cell area and large capacity storage in comparison with a NOR type.

A memory cell of a NAND flash memory includes a charge accumulation layer (floating gate) formed on a semiconductor substrate with a tunnel insulator interposed, and a control gate stacked on the charge accumulation layer with an intergate insulator interposed, and stores data in a nonvolatile manner through a charge accumulation state of the floating gate. Specifically, two value data storage is effected by defining, for example, a high threshold voltage state where electrons are injected into the floating gate as data "0", and defining a low threshold voltage state where electrons of the floating gate are discharged as data "1". Recently, multi value storage of four values and so on is also undertaken by subdividing a threshold distribution for writing.

In addition, there is also developed a MONOS memory cell that uses as the charge accumulation layer a silicon nitride film in place of the floating gate. The MONOS memory cell has as the charge accumulation layer a silicon nitride film formed on the semiconductor substrate with a thin tunnel oxide film of about 2 nm interposed. Write and erase of data in the MONOS memory cell is effected by injecting electrons or holes into the silicon nitride film from the semiconductor substrate to change an amount of accumulated charge of the silicon nitride film, thereby altering a threshold voltage of the memory cell.

In a NAND flash memory, a plurality of NAND cell units are aligned in a word line direction; and an assembly of the NAND cell units that share word lines configures a block. Erase of data in the NAND flash memory is executed in units of such a block. In erase of data, a voltage of 0V is applied to word lines of a selected block while at the same time a voltage of a well where the memory cells are formed is boosted to an erase voltage. Data is erased by utilizing resultant potential difference between the word lines and the well to discharge electrons from the floating gates of the memory cells. Moreover, in the case of a MONOS memory cell, data is erased by injecting holes into the silicon nitride film that is a charge trap film.

At this time, a potential of word lines connected to a non-selected block where erasure of data is not to be executed is set to a floating state. That is to say, a gate of a transfer transistor configured to transfer a voltage of a control gate line to a word line in a row decoder is set to 0V, cutting off a connection between the word line and the control gate line in the non-selected block. The word lines of the non-selected block are thereby set to the floating state. The potential of the word lines in the floating state rises due to coupling with the well that is boosted to the erase voltage. Consequently, there is no occurrence of a large potential difference between the word lines and the well, and erase of data stored in the memory cells of the non-selected block can be prevented (refer to Japanese Unexamined Patent Application Publication No. 2000-21186).

Here, a problem arises with a leak current characteristic of the transfer transistors in the row decoder. It is preferable that the transfer transistors in the row decoder effect a complete cutoff; in other words, that after the word lines of the non-selected block that are in the floating state have their potential raised to a potential close to that of the well potential, charge does not flow off from the word lines. However, in reality, a leak current occurs in the transfer transistors, and, if an erase operation time becomes long, the potential of the word lines of the non-selected block falls due to this leak current. There is a problem that, in this case, the potential difference between the word lines and the well in the non-selected block increases, and data stored in the memory cells ends up being erased accidentally.

Particularly in the case of a MONOS memory cell, an erase characteristic of a memory cell deteriorates with increasing miniaturization. As a result, a prolonged erase operation (of, for example, 10 msec) becomes necessary. However, considering a possibility of accidental erasure of data stored in the memory cell, then the erase operation time cannot simply be extended, and it is necessary to increase a number of erase operation loops.

SUMMARY OF THE INVENTION

A nonvolatile semiconductor memory device in accordance with a first aspect of the present invention includes: a memory cell array configured to have a plurality of blocks arranged thereon, each of the blocks being configured by an assembly of NAND cell units, each of the NAND cell units including a plurality of nonvolatile memory cells connected in series and having a first select gate transistor and a second select gate transistor disposed at respective ends thereof; word lines configured to commonly connect control gates of the memory cells aligned in a first direction; and a first select gate line and a second select gate line configured to commonly connect gates of the first select gate transistors and the second select gate transistors aligned in the first direction, respectively, a data erase operation in the nonvolatile semiconductor memory device being executed by first applying a pre-charge voltage to the word lines, then setting to a floating state the word lines in a non-selected block where erasure of data is not to be executed, applying a certain voltage to the word lines in a selected block where erasure of data is to be executed and applying an erase voltage to a well where the memory cell array is formed, thereby altering a threshold voltage of the memory cells in the selected block.

A nonvolatile semiconductor memory device in accordance with a second aspect of the present invention includes: a memory cell array configured to have a plurality of blocks arranged thereon, each of the blocks being configured by an assembly of NAND cell units, each of the NAND cell units including a plurality of nonvolatile memory cells connected in series and having a first select gate transistor and a second select gate transistor disposed at respective ends thereof; word lines configured to commonly connect control gates of the memory cells aligned in a first direction, the word lines having a pre-charge voltage applied thereto; and a first select gate line and a second select gate line configured to commonly connect gates of the first select gate transistors and the second select gate transistors aligned in the first direction, respectively, a data erase operation in the nonvolatile semiconductor memory device being executed by setting to a floating state the word lines in a non-selected block where erasure of data is not to be executed, applying a certain voltage to the word lines in a selected block where erasure of data is to be executed and applying an erase voltage to a well where the memory cell array is formed, thereby altering a threshold voltage of the memory cells in the selected block.

A nonvolatile semiconductor memory device in accordance with a third aspect of the present invention includes: a memory cell array configured to have a plurality of blocks arranged thereon, each of the blocks being configured by an assembly of NAND cell units, each of the NAND cell units including a plurality of nonvolatile memory cells connected in series and having a first select gate transistor and a second select gate transistor disposed at respective ends thereof; word lines configured to commonly connect control gates of the memory cells aligned in a first direction; and a first select gate line and a second select gate line configured to commonly connect gates of the first select gate transistors and the second select gate transistors aligned in the first direction, respectively, a pre-charge voltage being previously applied to the word lines in a non-selected block where erasure of data is not to be executed, and a data erase operation in the nonvolatile semiconductor memory device being executed by setting to a floating state the word lines in the non-selected block, applying a certain voltage to the word lines in a selected block where erasure of data is to be executed and applying an erase voltage to a well where the memory cell array is formed, thereby altering a threshold voltage of the memory cells in the selected block.

DETAILED DESCRIPTION OF THE EMBODIMENTS

Embodiments of the present invention are described below with reference to the drawings.

First Embodiment (Configuration of a Nonvolatile Semiconductor Memory Device in Accordance with a First Embodiment)

Figure 1:
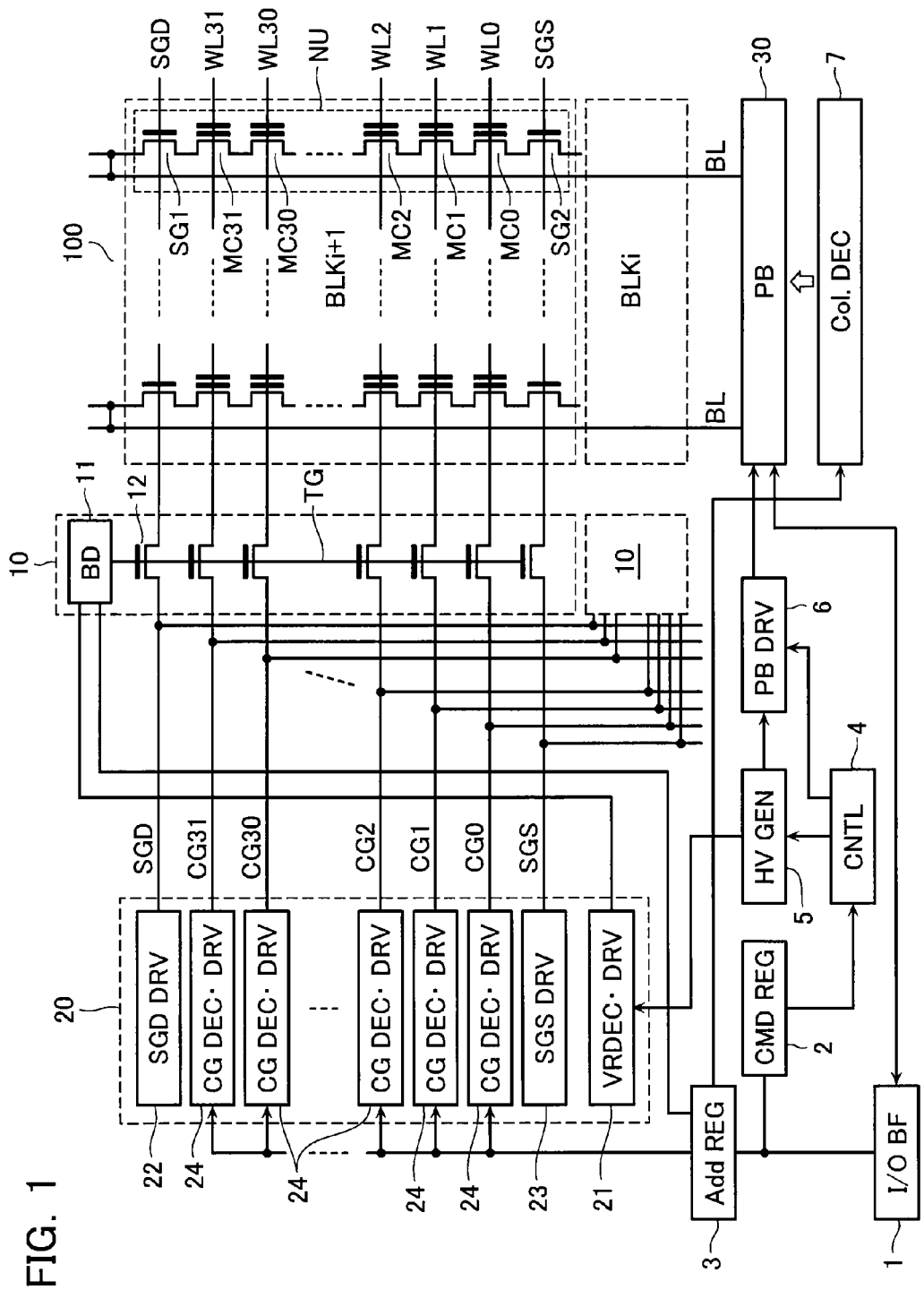
FIG. 1 is a view showing a configuration of a NAND flash memory in accordance with a first embodiment.
Figure 2:
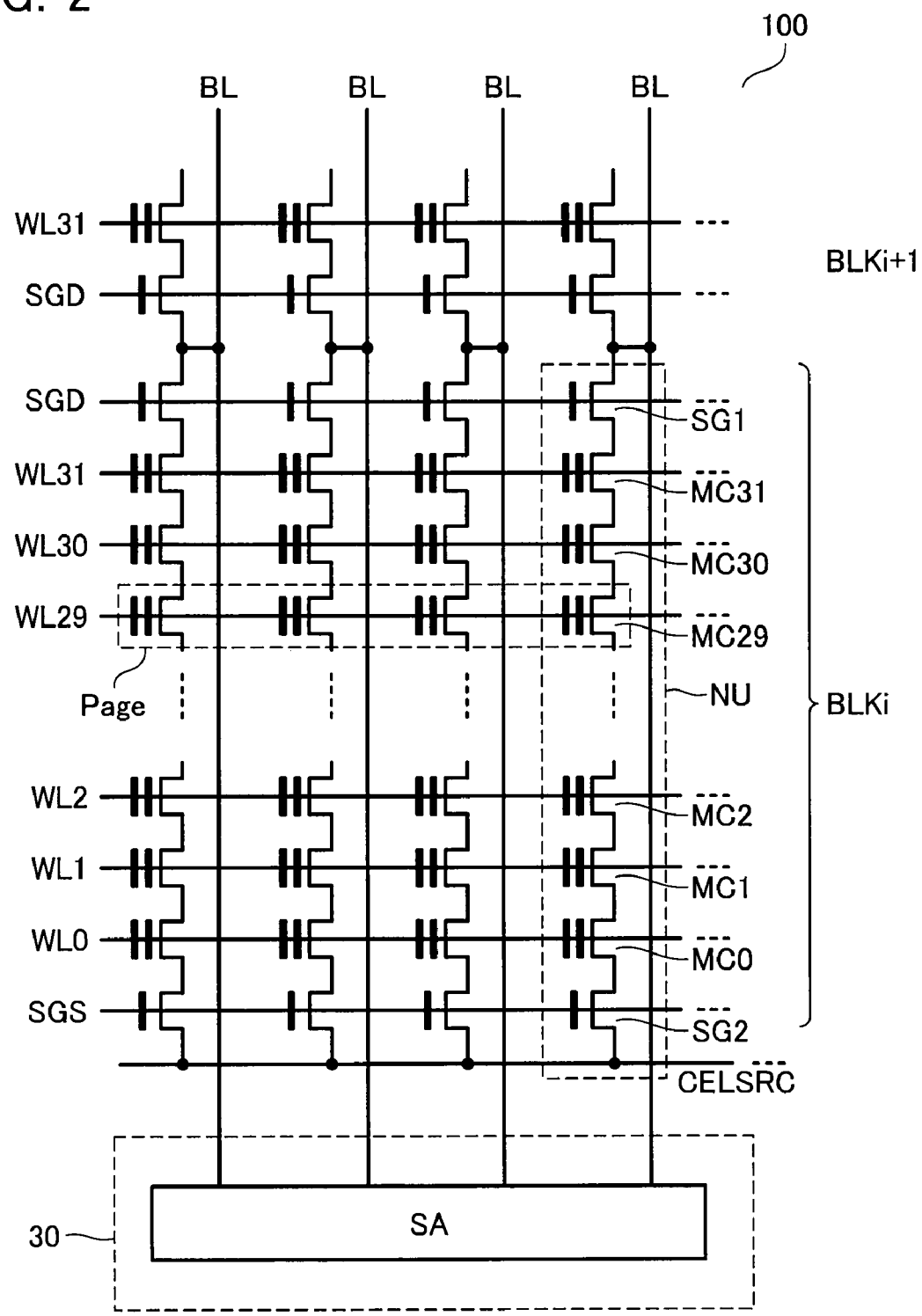
FIG. 2 is a view showing a memory cell array configuration in same flash memory.

FIG. 1 is a schematic view of an overall configuration of a NAND flash memory in accordance with a first embodiment, and FIG. 2 is a view showing an equivalent circuit of a memory cell array 100 of the NAND flash memory. A NAND cell unit (NAND string) NU which is a basic unit of the NAND flash memory has as a basic configuration a plurality of memory cells MC0-MC31 connected in series and two select transistors SG1 and SG2 disposed one each at the two ends thereof.

The NAND cell unit NU has one end thereof connected to a bit line BL via the select transistor SG1 and another end thereof connected to a source line CELSRC common to the memory cell array 100 via the select transistor SG2, as shown in FIG. 2.

A memory cell MC has a MONOS structure in which a silicon nitride film, acting as a charge accumulation layer, is formed on a semiconductor substrate with a thin tunnel oxide film of about 2 nm interposed, and a control gate is provided on the silicon nitride film with a gate insulator interposed. In addition, the memory cell MC may also have a stacked gate structure that has an N-type source/drain diffusion layer formed in a P-type well of a silicon substrate, and has a floating gate acting as the charge accumulation layer and a control gate. The NAND flash memory alters a charge amount held in the silicon nitride film (charge trap film) or the floating gate by a write operation and an erase operation, and thereby alters a threshold voltage of the memory cell MC to store one-bit or multi-bit data.

Control gates of the memory cells MC0-MC31 in the NAND cell unit NU are each connected to one of separate word lines WL0-WL31, and gates of the select transistors SG1 and SG2 are connected to select gate lines SGD and SGS, respectively.

An assembly of NAND cell units NU that share the word lines WL0-WL31 and the select gate lines SGD and SGS configure a block BLK which is a unit for batch erase of data. Normally, a plurality of blocks BLKi, BLKi+1, . . . , are arranged in a direction of the bit lines BL, as shown in the figure.

In the NAND flash memory shown in FIG. 1 a variety of operations are realized with a command input. For example, in a write operation, a data load command is latched in a command register 2 from an input/output (I/O) circuit 1. In addition, a write address is latched in an address register 3 via the I/O circuit 1, and write data is next loaded into a page buffer circuit 30 via the I/O circuit 1. When a write execute command is then latched in the command register 2 via the I/O circuit 1, the write operation automatically commences internally.

That is to say, when the write execute command is inputted, a sequence control circuit 4 begins the operation. In the case of the write operation, the sequence control circuit 4 implements control of voltage required in the write operation, control of timing of a write pulse application operation and a verify read operation, and so on.

A high voltage generation circuit 5 is controlled by the sequence control circuit 4 to generate a high voltage (boost voltage) such as a write voltage Vpgm and so on required by a row system signal drive circuit 20 and a page buffer driver 6. In addition, the high voltage generation circuit 5 generates also an erase voltage Vera that is applied to a well where the memory cell array 100 is formed during an erase operation.

The row system signal drive circuit 20 includes a number of control gate line decoder/drivers 24 each configured to control a word line voltage, the number being equivalent to a number of word lines WL in the NAND cell unit NU; a drain side select gate line driver 22 configured to control a drain side select gate line SGD; a source side select gate line driver 23 configured to control a source side select gate line SGS; and a block decoder/driver 21 for outputting a boosted voltage to a power supply node VRDEC of a block decoder 11. The drivers 21-24 are shared by a plurality of blocks BLK of the memory cell array 100.

In the NAND flash memory it is necessary to implement operations on a plurality of word lines WL of a selected NAND cell unit NU using a plurality of voltages. Therefore, a page address in the row address for selecting the word line WL in the NAND cell unit NU is inputted to the respective control gate line decoder/drivers 24.

Disposed at an end portion of a word line WL of each block BLK of the memory cell array 100 is a narrowly-defined row decoder 10 having a block select function. The row decoder 10 includes the block decoder 11 configured to receive a block address from the address register 3 and decode the block address; and transfer transistors 12 commonly controlled by an output of the block decoder 11 for transmitting to the word lines WL and the select gate lines SGD and SGS a voltage required for write, erase and read.

Each of the transfer transistors 12 has one end connected to an output of the drivers 22-24 and another end connected to the word lines WL and the select gate lines SGD and SGS in the memory cell array 100. For example, in the write pulse application operation, a write voltage Vpgm (about 20V) must be applied to selected word lines. Applied at this time to common gates TG of the transfer transistors 12 is Vpgm+Vt, which is supplied from the block decoder/driver 21 (Vt is a voltage corresponding to a threshold of the transfer transistors 12). Furthermore, during an erase operation, the transfer transistors 12 of the row decoder 10 attached to a selected block BLK where the erase operation is to be executed is set to an "on" state, and an erase voltage 0V is transferred from the control gate lines CG to the word lines WL. In addition, the transfer transistors 12 of the row decoder 10 attached to a non-selected block are set to an "off" state, and the word lines WL of the non-selected block BLK are set to a floating state.

The NAND flash memory uses an FN tunneling current in write and erase. Particularly in the write operation, unlike in the case of NOR memory cells, a large number of memory cells can be written simultaneously because a current required for threshold shift in one memory cell is minute. Consequently, a page length that is a batch processing unit in write and read can be increased to 2 kBytes or 4 kBytes. Included in the page buffer circuit 30 are an identical number of sense amplifiers SA to the number of page lengths.

In a case of loading write data, for example, a column decoder 7 decodes a column address sent from the address register 3, connects the I/O circuit 1 and the selected sense amplifier SA, and sets the write data for each column address in the page buffer circuit 30. Conversely, in a read operation, data that has been batch read into the page buffer circuit 30 is outputted to the I/O circuit 1 from a sense amplifier SA selected in accordance with the column address.

Although omitted from FIG. 1, in practice there is a circuit mounted between the I/O circuit 1 and the page buffer circuit 30 for realizing input/output of data at a certain cycle.

FIG. 2 shows an example where the bit lines of each block BLK are connected to a sense amplifier SA in the page buffer circuit 30. The sense amplifier SA controls the write operation or the read operation. The memory cells commonly connected to one word line WL and selected by the bit lines BL at this time configure one page that is the unit of simultaneous write or read.

Figure 3:
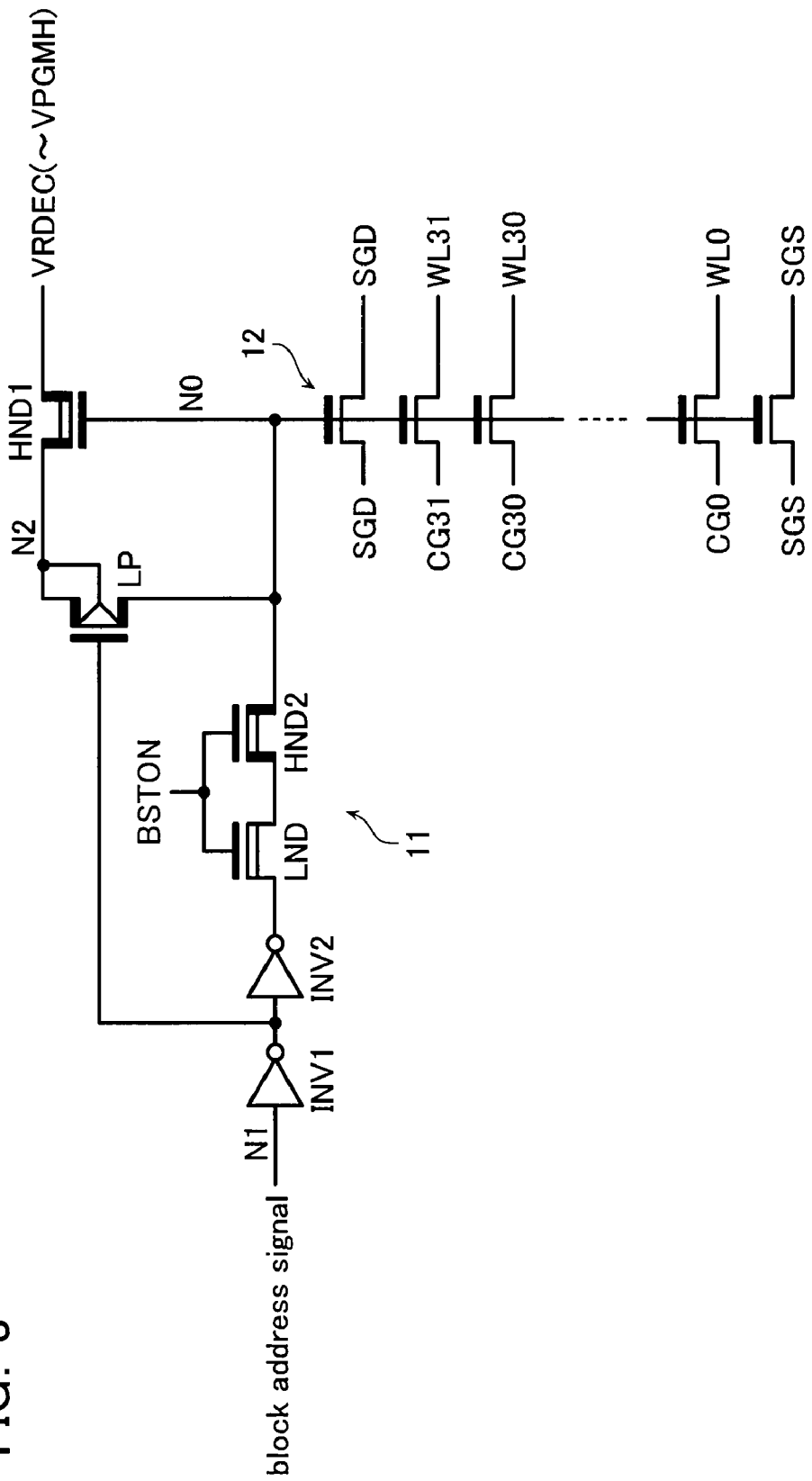
FIG. 3 is a view showing a configuration of a row decoder in same flash memory.

FIG. 3 shows a specific configuration of the block decoder 11 in the row decoder 10. The block decoder 11 sets a gate voltage of the transfer transistors 12 to switch a voltage of the control gate lines CG0-CG31, and the select gate lines SGD and SGS. The block decoder 11 outputs an output voltage to a node N0 in response to switching of a block address signal and a control signal BSTON. The block address signal is set to a power supply voltage VDD in a case of selection of the block BLK to which the block decoder 11 is connected, and is set to a reference voltage VSS in a case of non-selection.

Provided between the output node N0 and the power supply node VRDEC in the block decoder 11 are a transistor HND1 and a transistor LP connected in series with the transistor HND1 by a node N2 (a source of the transistor HND1). The transistor HND1 and the transistor LP configure a level shifter. The transistor HND1 is a high breakdown voltage depletion-type (D-type) N-channel MOS transistor having a negative value threshold voltage. The transistor LP is an enhancement-type (E-type) P-channel MOS transistor having a negative value threshold voltage.

The transistor HND1 has a drain thereof connected to the power supply node VRDEC, and the source thereof connected to a source of the transistor LP at the node N2; furthermore, a gate of the transistor HND1 has a voltage of the output node N0 positively fed back thereto. The transistor HND1 has a high voltage applied between the source and the drain thereof, and must therefore be of a high breakdown voltage type; a gate insulator of the transistor HND1 is thus thickly formed. Moreover, the threshold voltage of the transistor HND1 is set to a negative value (D-type) so that, in a case that a high voltage VPGMH is applied to the power supply node VRDEC and the gate, the high voltage VPGMH can be transferred to the node N2.

On the other hand, the transistor LP may be a low breakdown voltage type, and a film thickness of the gate insulator thereof can be set thin similarly to inverter circuits INV1 and INV2 and so on to be described hereafter. Note that there is a configuration such that a substrate (N-type well) of the transistor LP is short-circuited with a source of the transistor LP, enabling application of the high voltage VPGMH.

Connected in series between a node N1 that has an input voltage INPUT inputted thereto and the output node N0 are, in addition, the inverter circuits INV1 and INV2; an N-channel MOS transistor LND that is of a low breakdown voltage type (in other words, that has a gate insulator that is of the same type as that of the transistors configuring the inverter circuits INV1 and INV2) and that is D-type (in other words, that has a negative threshold voltage); and a high breakdown voltage D-type N-channel MOS transistor HND2 (that has a negative threshold voltage). The transistor LND and the transistor HND2 have the control signal BSTON applied to gates thereof, and as a whole configure a switching circuit.

A combination of a block address signal rising to the voltage VDD, along with the control signal BSTON rising from a voltage VSS to the voltage VDD causes a voltage of the node N0 in the block decoder 11 to rise. This raised voltage of the node N0 causes the transistor HND1 to be conductive and the node N2 to rise to the voltage VDD of the power supply node VRDEC. When the block address signal rises to the voltage VDD, a voltage inputted to the gate of the transistor LP falls; however, the node N2 rising to the voltage VDD causes the transistor LP to be set to a conductive state. As a result, a positive feedback loop due to the transistor HND1 and the transistor LP causes an output voltage of the node N0 to rise to the voltage VDD.

The transfer transistors 12, gates of which are commonly driven by the node N0, are driver transistors that respectively drive the word lines WL0-WL31 and the select gate lines SGD and SGS in the block BLK. Switching on of these transfer transistors 12 due to the voltage VDD of the node N0 causes voltages applied to the control gate lines CG0-CG31 and the select gate lines SGD and SGS in response to an operation mode to be transferred to the word lines WL0-WL31 and the select gate lines SGD and SGS, respectively.

(Operation of the Nonvolatile Semiconductor Memory Device in Accordance with the First Embodiment)

Figure 4:
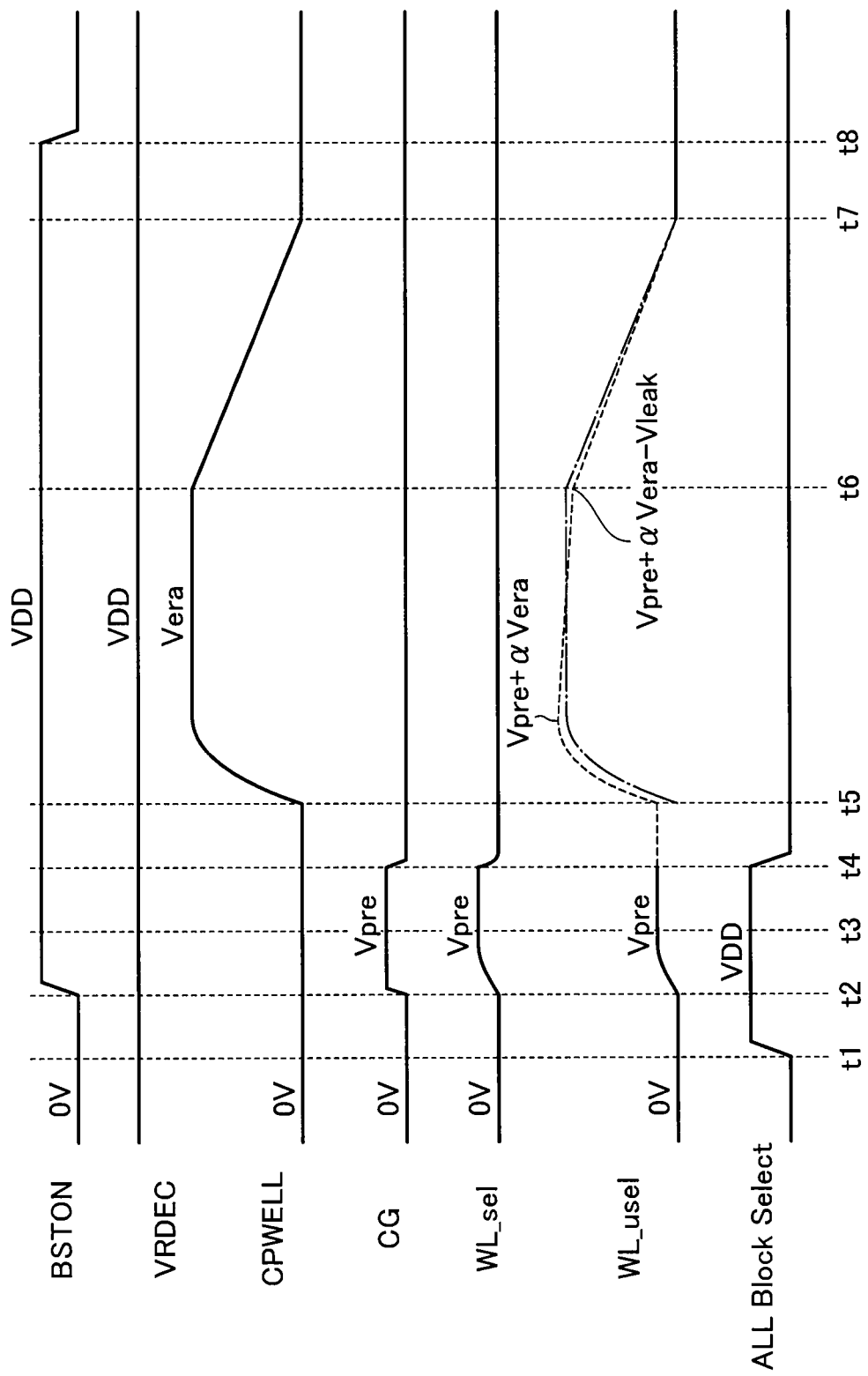
FIG. 4 is a timing chart explaining an erase operation in the NAND flash memory in accordance with the first embodiment.
Figure 5:
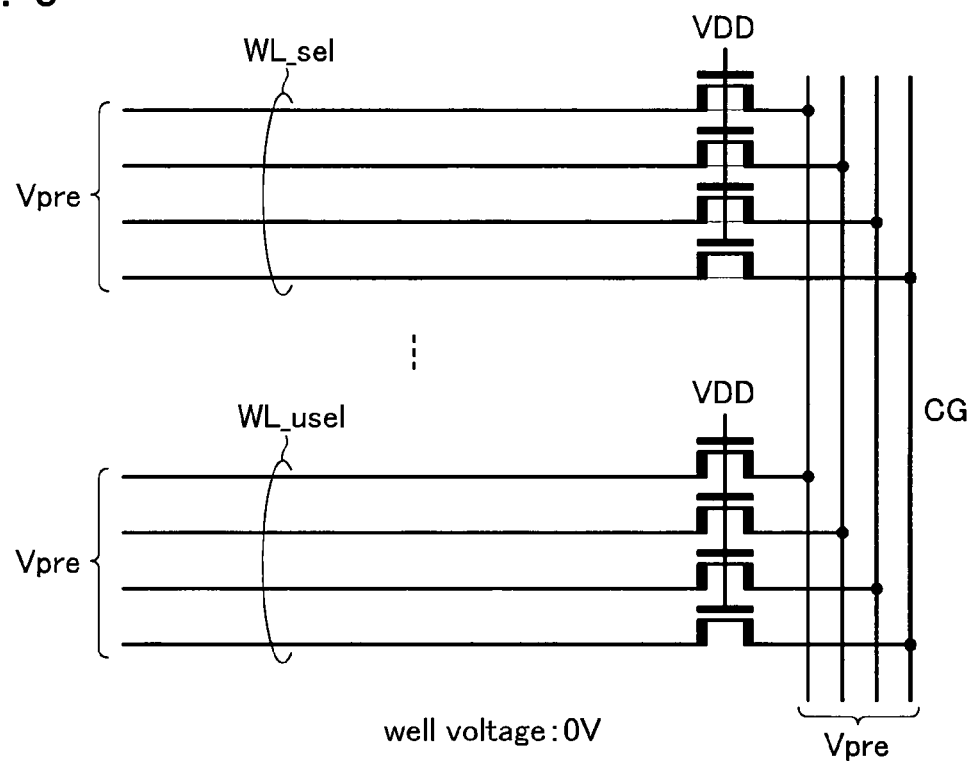
FIG. 5 is a figure explaining a potential of word lines during the erase operation in the NAND flash memory in accordance with the first embodiment.
Figure 6:
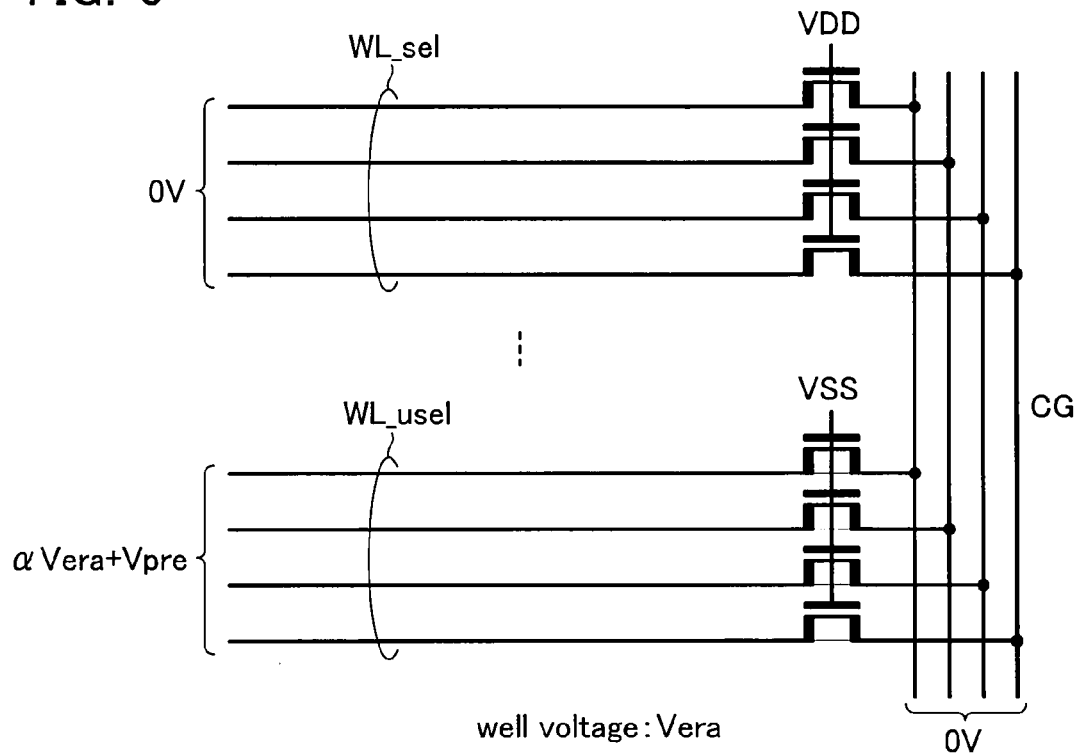
FIG. 6 is a figure explaining the potential of the word lines during the erase operation in the NAND flash memory in accordance with the first embodiment.

A data erase operation in the NAND flash memory in accordance with the present embodiment is now described with reference to the accompanying drawings. FIG. 4 is a timing chart for the data erase operation in the NAND flash memory in accordance with the present embodiment, and FIGS. 5 and 6 are views showing a state of a voltage applied to word lines during the data erase operation.

Described here is a case in which the block BLKi+1 shown in FIG. 1 is selected as an erase target block and the block BLKi is non-selected. Hereafter, a word line in a selected block BLKi+1 is taken to be in a selected state and indicated as word line WL_sel, and a word line in a non-selected block BLKi is taken to be in a non-selected state and indicated as word line WL_usel.

At time t1, a signal ALL Block Select that selects all blocks including a non-selected block BLKi is raised to the potential VDD. The signal ALL Block Select is inputted from the I/O circuit 1 to the row decoder 10 via the address register 3. In addition, the potential VDD is applied to the power supply node VRDEC of the block decoder 11 from the block decoder/driver 21.

Next, at time t2, the control signal BSTON is raised. At a time of data erase in the row decoder 10, the control signal BSTON is "H", and the node N0 is set to VDD. As a result, the transfer transistors 12 of the selected block BLKi+1 and the non-selected block BLKi become "on", and the control gate lines CG0-CG31 and the word lines WL_sel and WL_usel are electrically connected.

Additionally at time t2, the control gate line decoder/drivers 24 drive the control gate lines CG to a pre-charge potential Vpre. Since the control gate lines CG are electrically connected with all of the word lines WL of the selected block BLKi+1 and the non-selected block BLKi, the potential of the word lines WL_sel and WL_usel are both raised to the voltage Vpre (refer to FIG. 5).

It is required that time t3 must be passed for raising the potential of the word lines WL_sel and WL_usel up to the potential Vpre. Then, at time t4, the signal ALL Block Select is caused to fall. As a result, the transfer transistors 12 of the row decoder 10 attached to the non-selected block BLKi are set to an "off" state, and the control gate lines CG and the word lines WL_usel are made to be in a non-conductive state. That is to say, the word lines WL_usel are set to a floating state.

Additionally at time t4, the potential of the control gate lines CG is set to 0V. Even when the signal ALL Block Select has fallen, the block address signal in the row decoder 10 of the selected block BLKi+1 is in an "H" state. As a result, the word lines WL_sel remain electrically connected with the control gate lines CG and is of the same potential, namely 0V, as the control gate lines CG.

Next, at time t5, a well potential CPWELL of the semiconductor substrate where the memory cells MC are disposed is raised to a potential Vera. The word lines WL_sel of the selected block BLKi+1 are held at the same 0V as the control gate lines CG. Consequently, holes are injected into the charge trap film of the memory cells from the semiconductor substrate due to a potential difference with the potential Vera of the well, and erase of data is executed. In contrast, coupling with the well results in the potential of the word lines WL_usel of the non-selected block BLKi rising by as much as $\alpha$*Vera (where $\alpha$ is a coupling ratio, $\alpha<1$). That is to say, the potential of the word lines WL_usel becomes a potential Vpre+$\alpha$ Vera (refer to FIG. 6).

Erase of data in the memory cells MC is executed between time t5 and time t6. The transfer transistors 12 of the row decoder 10 attached to the non-selected block BLKi are not completely cut off here, and a minute leak current occurs. As a result, the potential of the word lines WL_usel gradually decreases by time t6. The potential of the word lines WL_usel at time t6 becomes a potential Vpre+$\alpha$ Vera−Vleak where the potential Vpre+$\alpha$ Vera is reduced by a potential Vleak caused by the leak current of the transfer transistors 12.

The data erase is executed and then, from time t6 to time t7, the well is discharged and the well potential CPWELL is lowered. Then, at time t8, the control signal BSTON is lowered thereby completing the erase operation of the NAND flash memory.

(Effect of the Nonvolatile Semiconductor Memory Device in Accordance with the First Embodiment)

The NAND flash memory in accordance with the present embodiment allows prevention of accidental erasure of data stored in the memory cells MC during an erase operation. This is specifically described below with reference to a comparative example.

Figure 7:
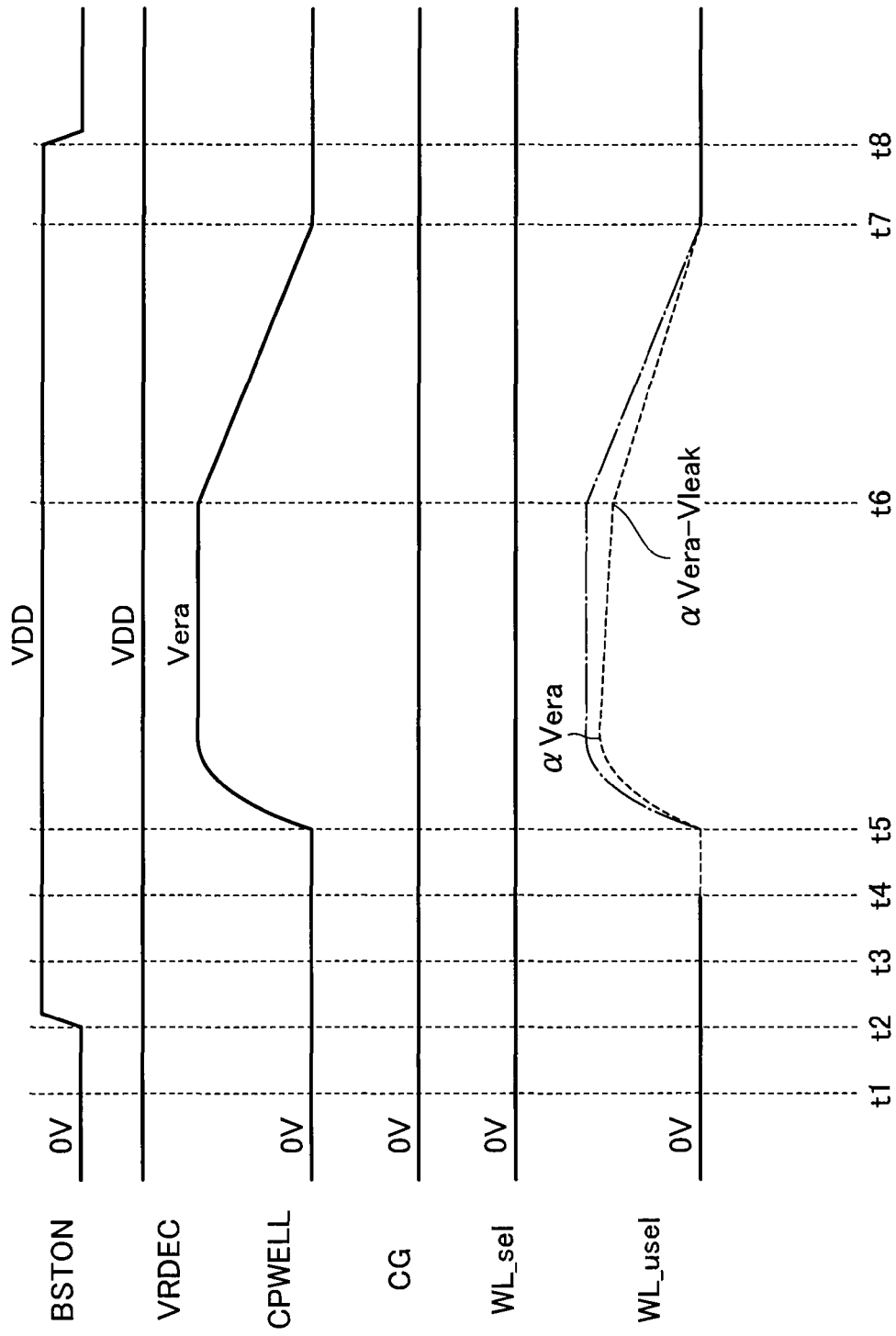
FIG. 7 is a timing chart explaining an erase operation in a comparative example of a NAND flash memory.
Figure 8:
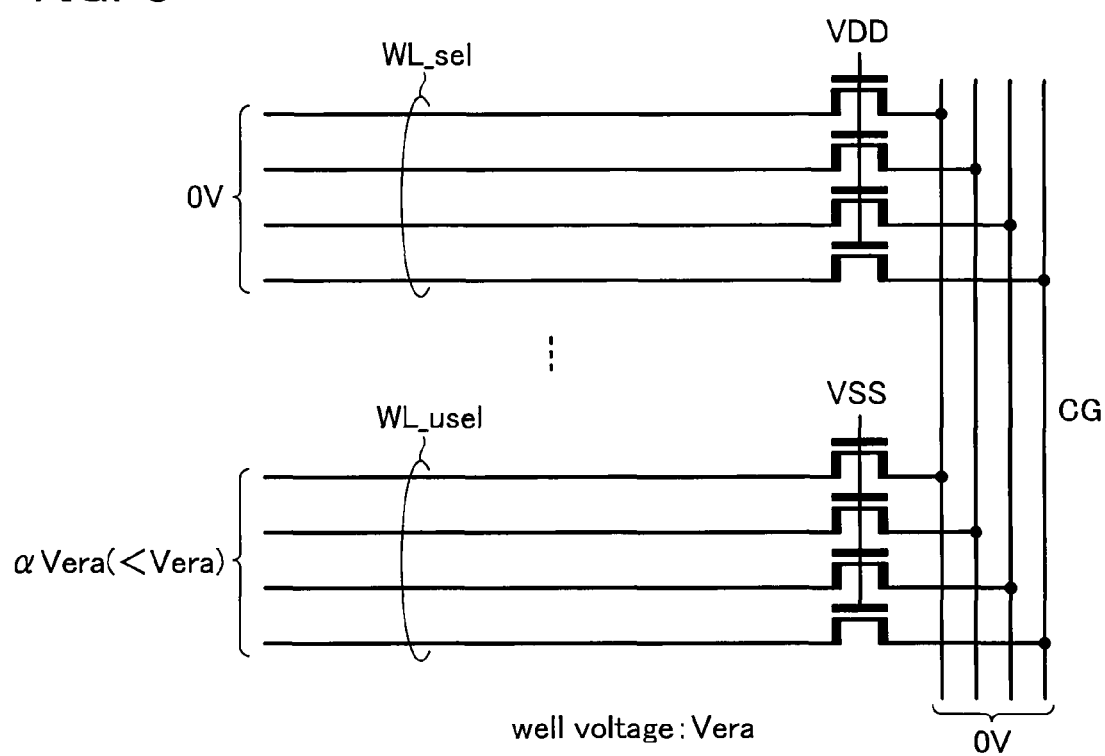
FIG. 8 is a figure explaining a potential of word lines during the erase operation in the comparative example of a NAND flash memory.

A basic configuration of the comparative example of a NAND flash memory is identical to that of the above-described NAND flash memory in accordance with the present embodiment. The comparative example of a NAND flash memory differs from the NAND flash memory in accordance with the present embodiment in the point that during an erase operation the pre-charge voltage Vpre is not applied to the word lines WL_usel of the non-selected block BLKi. FIG. 7 is a timing chart for during the data erase operation of the comparative example of a NAND flash memory, and FIG. 8 is a view showing a state of a voltage applied to word lines during the data erase operation.

As shown in FIG. 7, in the comparative example of a NAND flash memory, the pre-charge voltage Vpre is not applied to the word lines WL_sel and WL_usel during a time from time t2 to time t4.

In this state, at time t5, the well potential CPWELL of the semiconductor substrate where the memory cells MC are disposed is raised to the potential Vera. Since the word lines WL_sel of the selected block BLKi+1 are held at the same 0V as the control gate lines CG, holes are injected into the charge trap film of the memory cells from the semiconductor substrate due to the potential difference with the potential Vera of the well, and erase of data is executed. In contrast, coupling with the well results in the potential of the word lines WL_usel of the non-selected block BLKi rising by as much as α*Vera (where α is the coupling ratio, α<1) (refer to FIG. 8).

Erase of data in the memory cells MC is executed between time t5 and time t6. The transfer transistors 12 of the row decoder attached to the non-selected block BLKi are not completely cut off here, and a minute leak current occurs. As a result, the potential of the word lines WL_usel gradually decreases by time t6. The potential of the word lines WL_usel at time t6 becomes a potential αVera−Vleak where the potential αVera is reduced by the potential Vleak caused by the leak current of the transfer transistors 12.

Subsequently, from time t6 to time t7, the well is discharged and the well potential CPWELL is lowered. Then, at time t8, the control signal BSTON is lowered thereby completing the erase operation of the NAND flash memory.

In the comparative example of a NAND flash memory, a potential difference Vera−(αVera−Vleak) between the potential of the word lines WL_usel shown in FIG. 7 by a dashed line and the well potential Vera shown in FIG. 7 by an alternate long and short dashed line becomes a maximum at time t6. There is a risk that this potential difference causes holes to be accidentally injected into the charge trap film of the memory cells MC of the non-selected block BLKi, and that data stored in the memory cells gets erased.

By contrast, in the NAND flash memory in accordance with the present embodiment, the pre-charge voltage Vpre is applied in advance to the word lines WL_usel. In the NAND flash memory in accordance with the present embodiment, even if there occurs a voltage drop Vleak caused by the leak current, a potential difference Vera−(Vpre+αVera−Vleak) between the potential of the word lines WL_usel shown in FIG. 4 by a dashed line and the well potential Vera shown in FIG. 4 by an alternate long and short dashed line is suppressed. As a result, a possibility that data stored in the memory cells is accidentally erased can be reduced in comparison with the case that the pre-charge voltage is not applied to the word lines.

A voltage value of the pre-charge voltage Vpre can be set so that, even in a case that a period of time required for the data erase operation (from time t5 to time t6) has elapsed and the voltage of the word lines WL_usel in the non-selected block BLKi has fallen, the word lines WL_usel maintain a voltage value at which there is no occurrence of an erase operation in the memory cells MC.

As mentioned above, in the NAND flash memory in accordance with the present embodiment, accidental erasure of stored data during the erase operation can be prevented. As a result, a duration of the erase operation on the memory cells of the selected block can be extended. This is described below.

First, a permissible erase operation time in the comparative example of a NAND flash memory is calculated. In the comparative example of a NAND flash memory, if a total capacity per line of the word lines WL is taken to be C, and the leak current of a transfer transistor 12 is taken to be Ioff (A/s), then a value of a voltage drop increment ΔV (=−Vleak) due to the leak current of the transfer transistor 12 can be obtained as follows.

$$C \cdot \Delta V / t = \text{Ioff}$$

$$\therefore \Delta V = t \cdot \text{Ioff} / C$$

A limit potential difference Vlim between the word lines and the well where holes are injected into the charge trap film of the memory cells MC at this time can be obtained as follows.

$$Vlim = Vera - \alpha Vera - \Delta V$$
$$= Vera - \alpha Vera - t \cdot \text{Ioff} / C$$

A permissible erase operation time t in the comparative example can thus be obtained as follows.

$$t = (C / \text{Ioff}) \cdot (Vera - \alpha Vera - Vlim)$$

On the other hand, in a case of the NAND flash memory in accordance with the present embodiment, the limit potential difference Vlim can be obtained as follows.

$$Vlim = Vera - \alpha Vera + Vpre - \Delta V$$
$$= Vera - \alpha Vera + Vpre - t \cdot \text{Ioff} / c$$

The permissible erase operation time t can be obtained as follows.

$$t = (C / \text{Ioff}) \cdot (Vera - \alpha Vera + Vpre - Vlim)$$

It therefore becomes possible to extend the erase operation time by up to C·Vpre/Ioff compared with the comparative example of a NAND flash memory.

As described above, the erase operation time of data in the NAND flash memory in accordance with the present embodiment can be extended. As a result, there is an increased possibility of being able to erase stored data of a memory cell in one unit cycle of an erase operation, and it becomes possible also to reduce a number of repetitions of the erase operation on the selected block.

Second Embodiment (Configuration of a Nonvolatile Semiconductor Memory Device in Accordance with a Second Embodiment)

Next, a second embodiment of the present invention is described. A basic configuration of a memory cell array 100 and so on in a NAND flash memory of the present embodiment is identical to that of the NAND flash memory in the above-described first embodiment.

In the NAND flash memory in accordance with the present embodiment, word lines to which a pre-charge voltage Vpre is applied during an erase operation differ from those in the NAND flash memory in accordance with the first embodiment. In the NAND flash memory in accordance with the present embodiment, the pre-charge voltage Vpre is applied only to the word lines of an unselected block where an erase operation is not to be executed.

(Operation of the Nonvolatile Semiconductor Memory Device in Accordance with the Second Embodiment)

Figure 9:
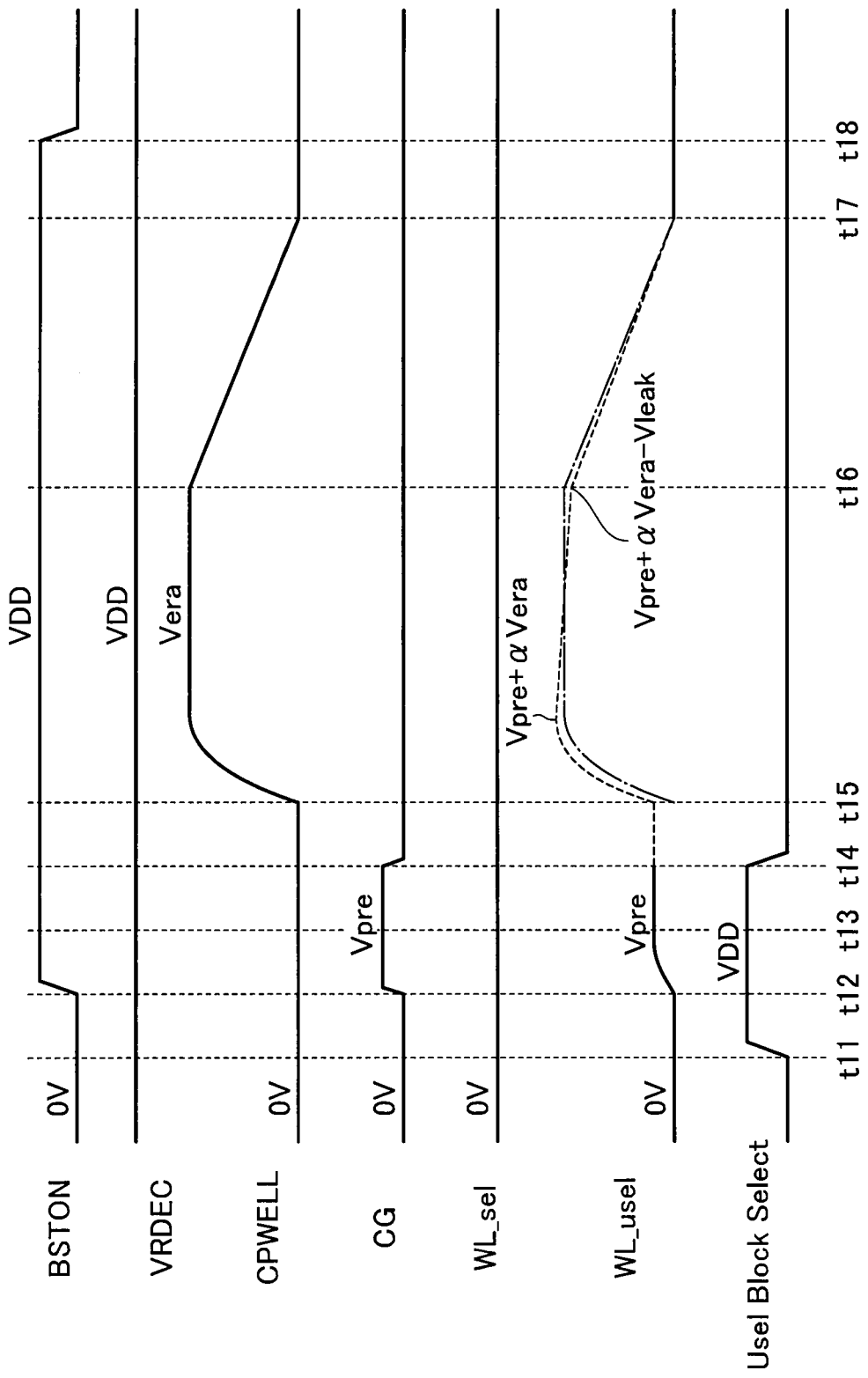
FIG. 9 is a timing chart explaining an erase operation in a NAND flash memory in accordance with a second embodiment.

An erase operation in the NAND flash memory in accordance with the present embodiment is now described with reference to FIG. 9. FIG. 9 is a timing chart for during a data erase operation in the NAND flash memory in accordance with the present embodiment.

At time t11, a signal Usel Block Select that selects a non-selected block BLKi is raised to the potential VDD. The signal Usel Block Select is inputted from the I/O circuit 1 to the row decoder 10 via the address register 3. A block address signal in an "H" state is applied to the block decoder 11 attached to the non-selected block BLKi. In contrast, the block decoder 11 attached to a selected block BLKi+1 has a block address signal in an "L" state applied thereto. In addition, the potential VDD is applied to the power supply node VRDEC of the block decoder 11 from the block decoder/driver 21.

Next, at time t12, the control signal BSTON is raised. At a time of data erase in the row decoder 10 of the non-selected block BLKi, the control signal BSTON is "H", and the node N0 is set to VDD. As a result, the transfer transistors 12 of the non-selected block BLKi become "on", and the control gate lines CG0-CG31 and the word lines WL_usel are electrically connected.

Additionally at time t12, the control gate line decoder/drivers 24 drive the control gate lines CG to the pre-charge potential Vpre. Since the control gate lines CG are electrically connected with the word lines WL_usel of the non-selected block BLKi, the potential of the word lines WL_usel is raised to the voltage Vpre.

It is required that time t13 must be passed for raising the potential of the word lines WL_usel up to the potential Vpre. Then, at time t14, the signal Usel Block Select is caused to fall. As a result, the transfer transistors 12 of the row decoder 10 attached to the non-selected block BLKi are set to an "off" state, and the control gate lines CG and the word lines WL_usel are made to be in a non-conductive state. That is to say, the word lines WL_usel are set to a floating state.

Additionally at time t14, the potential of the control gate lines CG is set to 0V. In the present embodiment, subsequent to lowering of the signal Usel Block Select, the block address signal in the row decoder 10 of the selected block BLKi+1 is set to an "H" state. The word lines WL_sel are electrically connected with the control gate lines CG and are held at the same potential, namely 0V, as the control gate lines CG.

Since applied voltages, timing of signals, voltage values, and so on, in the erase operation for time t15 and after are similar to corresponding ones for time t5 and after in the first embodiment, descriptions thereof are omitted.

(Effect of the Nonvolatile Semiconductor Memory Device in Accordance with the Second Embodiment)

In the NAND flash memory in accordance with the present embodiment, the pre-charge voltage Vpre is applied in advance to the word lines WL_usel. Therefore, even if there occurs a voltage drop Vleak caused by the leak current, a potential difference with the well potential Vera is suppressed, as shown in FIG. 9. As a result, a possibility that data stored in the memory cells is accidentally erased can be reduced.

In addition, the NAND flash memory in accordance with the present embodiment enables the erase operation time of data to be extended, similarly to the first embodiment. As a result, there is an increased possibility of being able to erase stored data of a memory cell in one unit cycle of an erase operation, and it becomes possible also to reduce a number of repetitions of the erase operation on the selected block.

In the NAND flash memory in accordance with the present embodiment, a pre-charge is executed only on the word lines WL_usel that are connected to the non-selected block BLKi. A pre-charge time can be shortened, since a lesser number of word lines require to be pre-charged in comparison with executing a pre-charge operation on all of the word lines WL in the memory cell array.

Third Embodiment (Configuration of a Nonvolatile Semiconductor Memory Device in Accordance with a Third Embodiment)

Figure 10:
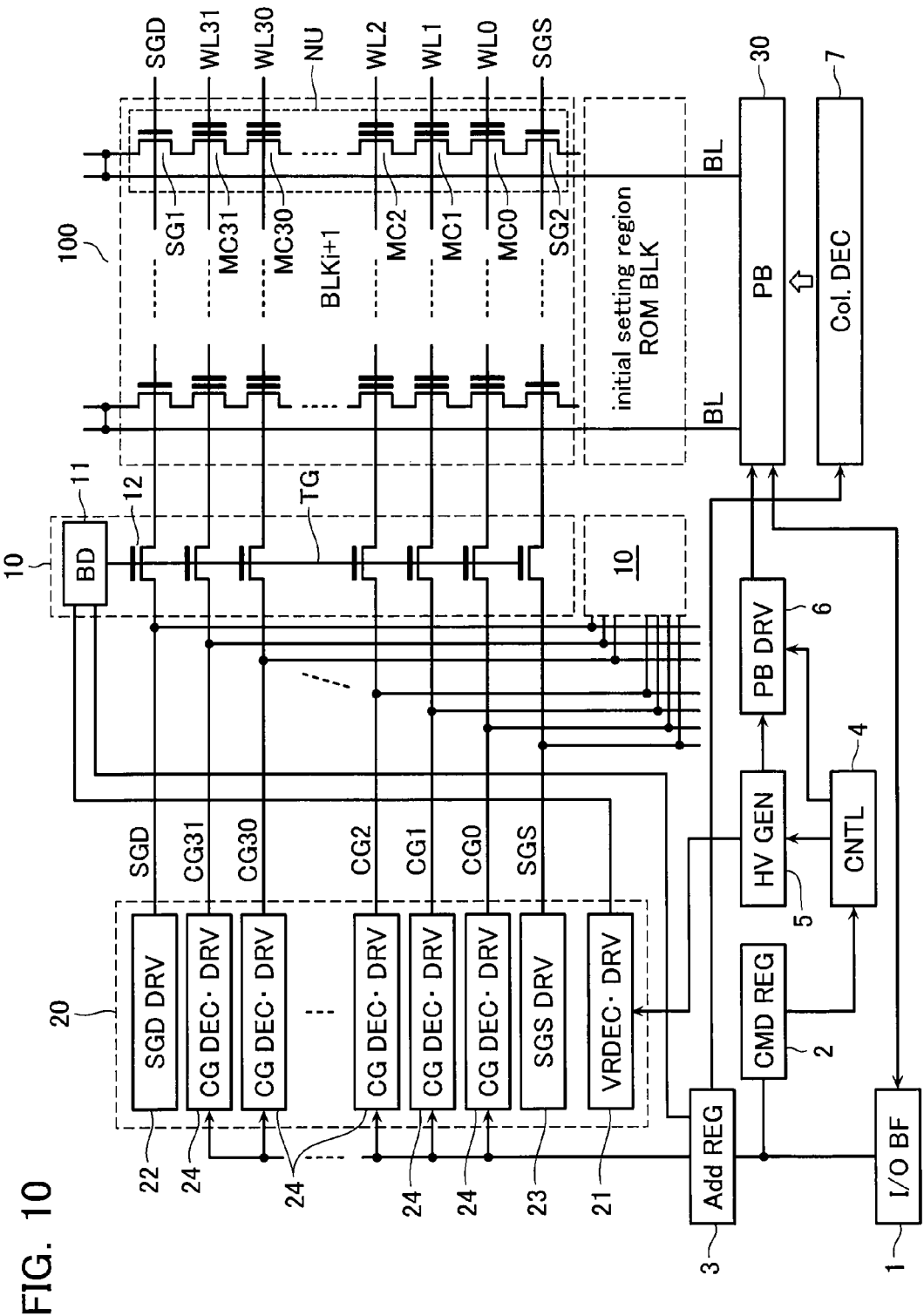
FIG. 10 is a view showing a configuration of a NAND flash memory in accordance with a third embodiment.

Next, a third embodiment of the present invention is described. FIG. 10 is a schematic view of an overall configuration of a NAND flash memory in accordance with the third embodiment. A basic configuration of a memory cell array 100 and so on in the NAND flash memory of the present embodiment is identical to that of the NAND flash memory in the above-described first embodiment.

The NAND flash memory in accordance with the present embodiment differs from the first embodiment in the point that the non-selected block is an initial setting region ROMBLK that stores initial setting data such as control parameters to control the operation of the flash memory. Included in the initial setting data stored in the initial setting region ROMBLK are the likes of defective address data for defective cell replacement, voltage setting data of a write voltage and so on, voltage adjusting data that adjusts a setting voltage according to dispersions in a process, and control parameters for write and erase. The NAND flash memory effects the operations of write, read, or erase, and so on, on the basis of the initial setting data.

(Operation of the Nonvolatile Semiconductor Memory Device in Accordance with the Third Embodiment)

Figure 11:
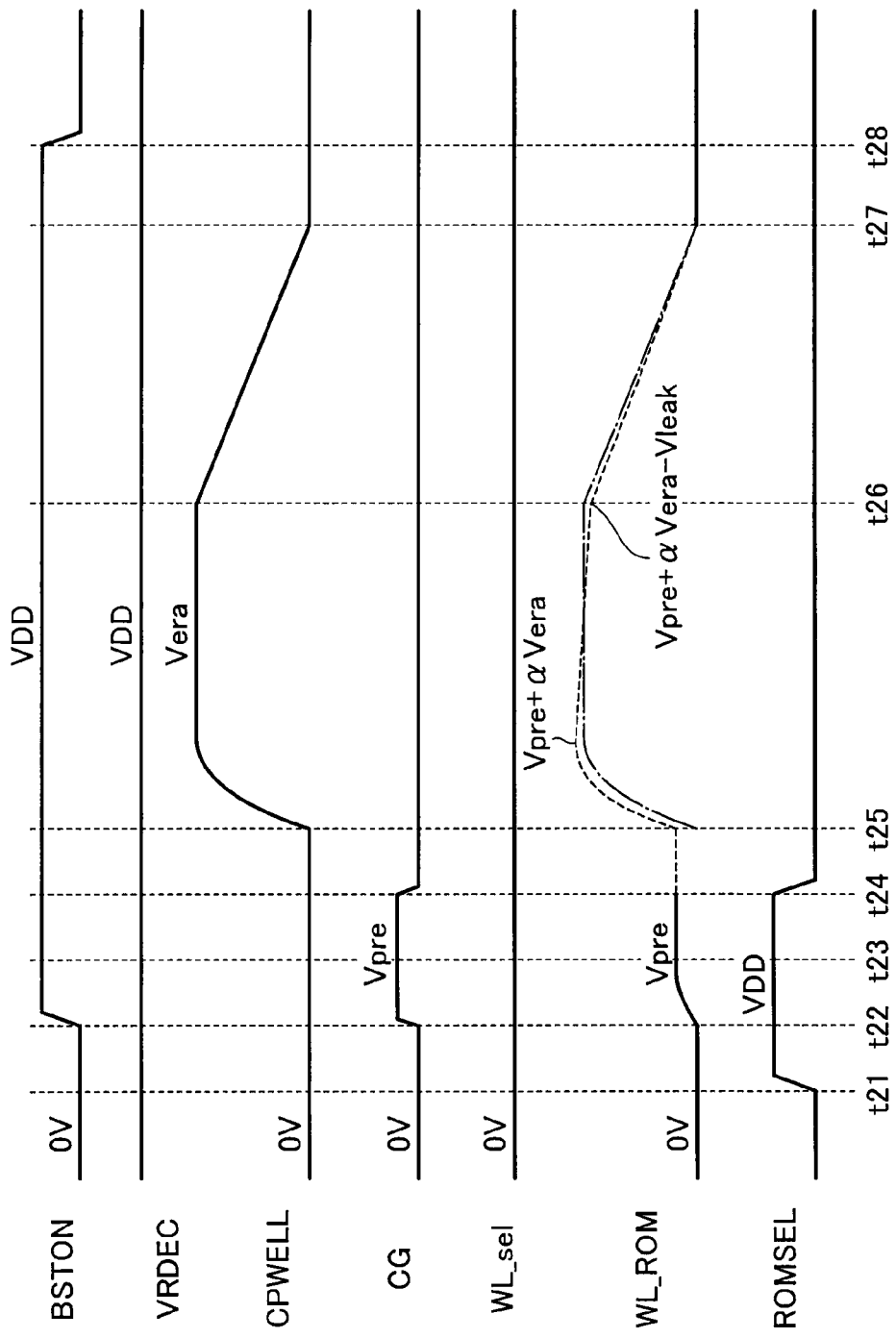
FIG. 11 is a timing chart explaining an erase operation in the NAND flash memory in accordance with the third embodiment.

An erase operation in the NAND flash memory in accordance with the present embodiment is now described with reference to FIG. 11. FIG. 11 is a timing chart of during the data erase operation in the NAND flash memory in accordance with the present embodiment.

Here, the non-selected block that has not been selected as an erase target is the initial setting region ROMBLK that stores the initial setting data, and a word line in the initial setting region ROMBLK is indicated as word line WL_ROM. Moreover, the selected block BLKi+1 that is the erase target is all blocks except for the initial setting region ROMBLK, and the erase operation of the present embodiment described here is a batch erase operation in which the NAND flash memory initializes stored data. In the NAND flash memory in accordance with the present embodiment, it is only the word lines WL_ROM of the initial setting region ROMBLK to which a pre-charge voltage Vpre is applied during the erase operation.

At time t21, a signal ROMSEL that selects the initial setting region ROMBLK is raised to the potential VDD. The signal ROMSEL is inputted from the I/O circuit 1 to the row decoder 10 via the address register 3. A block address signal in an "H" state is applied to the block decoder 11 attached to the initial setting region ROMBLK. Here, a block address signal in an "L" state is applied to the block decoder 11 attached to the selected block BLKi+1. In addition, the potential VDD is applied to the power supply node VRDEC of the block decoder 11 from the block decoder/driver 21.

Next, at time t22, the control signal BSTON is raised. At a time of data erase in the row decoder 10 of the non-selected block BLKi, the control signal BSTON is "H", and the node N0 is set to VDD. As a result, the transfer transistors 12 of the initial setting region ROMBLK become "on", and the control gate lines CG0-CG31 and the word lines WL_ROM are electrically connected.

Additionally at time t22, the control gate line decoder/drivers 24 drive the control gate lines CG to the pre-charge potential Vpre. Since the control gate lines CG are electrically connected with all of the word lines WL_ROM of the initial setting region ROMBLK, the potential of the word lines WL_ROM is raised to the voltage Vpre.

It is required that time t23 must be passed for raising the potential of the word lines WL_ROM up to the potential Vpre. Then, at time t24, the signal ROMSEL is caused to fall. As a result, the transfer transistors 12 of the row decoder 10 attached to the initial setting region ROMBLK are set to an "off" state, and the control gate lines CG and the word lines WL_ROM are made to be in a non-conductive state. That is to say, the word lines WL_ROM are set to a floating state.

Additionally at time t24, the potential of the control gate lines CG is set to 0V. In the present embodiment, subsequent to lowering of the signal ROMSEL, the block address signal in the row decoder 10 of the selected block BLKi+1 is set to an "H" state. The word lines WL_sel are electrically connected with the control gate lines CG and are held at the same potential, namely 0V, as the control gate lines CG.

Since applied voltages, timing of signals, voltage values, and so on, in the erase operation for time t25 and after are similar to corresponding ones for time t5 and after in the first embodiment, descriptions thereof are omitted.

(Effect of the Nonvolatile Semiconductor Memory Device in Accordance with the Third Embodiment)

In the NAND flash memory in accordance with the present embodiment, the pre-charge voltage Vpre is applied in advance to the word lines WL_ROM. Therefore, even if there occurs a voltage drop Vleak caused by the leak current, a potential difference with the well potential Vera is suppressed, as shown in FIG. 11. As a result, a possibility that data stored in the memory cells is accidentally erased can be reduced.

In addition, the NAND flash memory in accordance with the present embodiment enables the erase operation time of data to be extended, similarly to the first embodiment. As a result, there is an increased possibility of being able to erase stored data of a memory cell in one unit cycle of an erase operation, and it becomes possible also to reduce a number of repetitions of the erase operation on the selected block.

In a case of batch erasure of data of the NAND flash memory, if all the word lines are pre-charged and then discharged to 0V to execute the erase operation, there is a risk that a number of word lines WL to be pre-charged increases and a time required for pre-charging becomes long. However, in the NAND flash memory in accordance with the present embodiment, a pre-charge is executed only on the word lines WL_ROM connected to the initial setting region ROMBLK that stores the initial setting data. A pre-charge time can be shortened, since a lesser number of word lines on which the pre-charge operation is to be executed is required.

In addition, since the word lines of most of the blocks BLK are selected and become 0V during a batch erase operation of data held in the NAND flash memory, a long time is required for charging and discharging of the well. As a result, there is an increased effect of the voltage drop due to the leak current of the word lines WL_ROM of the initial setting region ROMBLK. Pre-charging of the word lines WL_ROM in the NAND flash memory in accordance with the present invention enables the erase operation time to be extended, and accidental erasure of data stored in the NAND flash memory to be effectively prevented.

Fourth Embodiment (Configuration of a Nonvolatile Semiconductor Memory Device in Accordance with a Fourth Embodiment)

Next, a fourth embodiment of the present invention is described. A basic configuration of a memory cell array 100 and so on in a NAND flash memory of the present embodiment is identical to that of the NAND flash memory in the above-described first embodiment.

A timing with which the pre-charge voltage Vpre is applied to the word lines during an erase operation in the NAND flash memory in accordance with the present embodiment differs from that in the NAND flash memory in accordance with the first embodiment. In the NAND flash memory in accordance with the present embodiment, the word lines commonly connect gates of the memory cells MC, and are applied with the pre-charge voltage.

(Operation of the Nonvolatile Semiconductor Memory Device in Accordance with the Fourth Embodiment)

Figure 12:
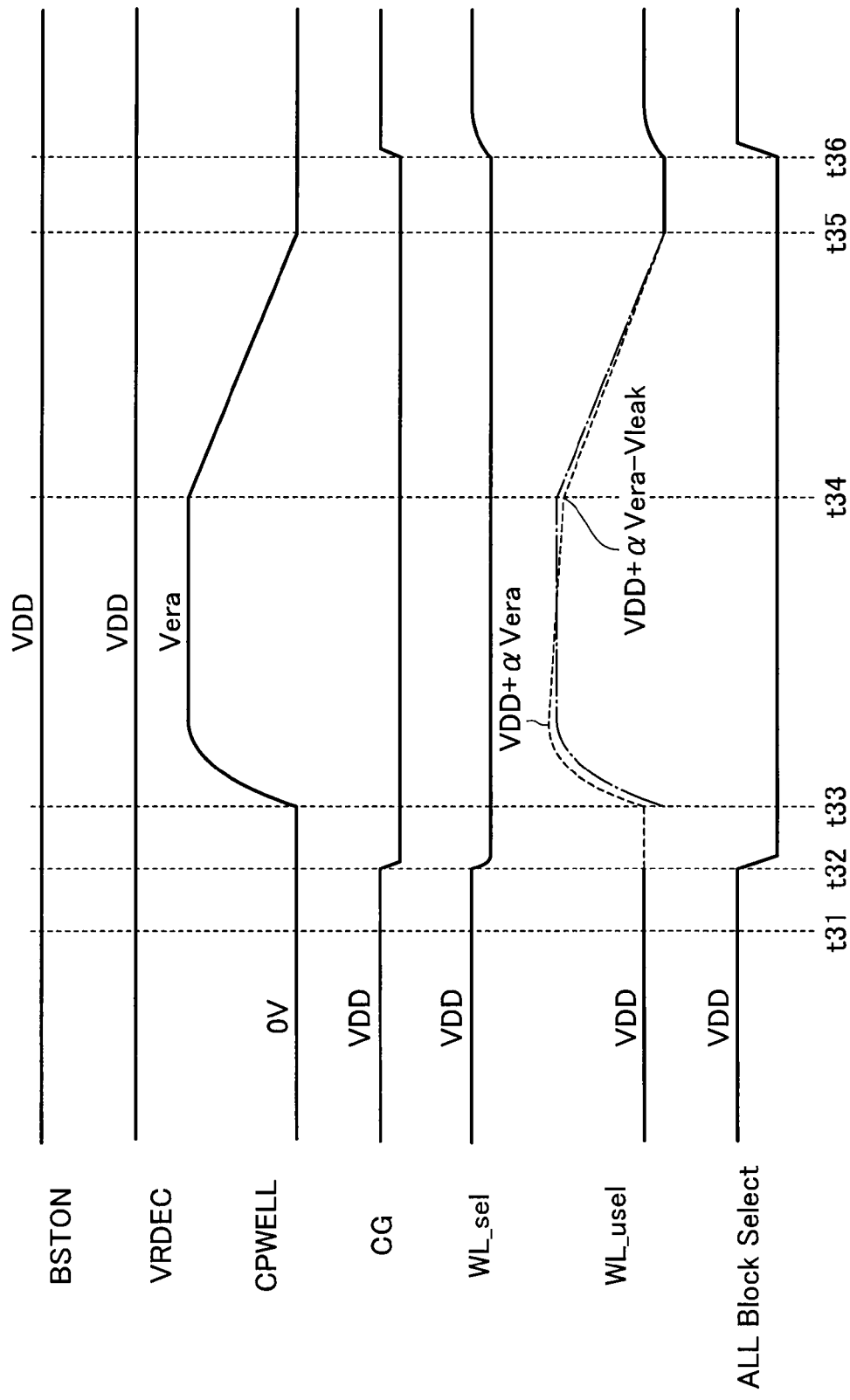
FIG. 12 is a timing chart explaining the erase operation in the NAND flash memory in accordance with the third embodiment.

An erase operation in the NAND flash memory in accordance with the present embodiment is now described with reference to FIG. 12. FIG. 12 is a timing chart of during the data erase operation in the NAND flash memory in accordance with the present embodiment.

In the present embodiment, similarly to in the first embodiment, a word line in the non-selected block BLKi that has not been selected as an erase target is indicated as word line WL_usel, and a word line in the selected block BLKi+1 that is the erase target is indicated as word line WL_sel.

At time t31, prior to a reset operation, the signal ALL Block Select that selects all blocks including the non-selected block BLKi is at a raised state of potential VDD. The signal ALL Block Select is inputted from the I/O circuit 1 to the row decoder 10 via the address register 3. A block address signal in an "H" state is applied to all of the block decoders 11. In addition, the potential VDD is applied to the power supply node VRDEC of the block decoders 11 from the block decoder/driver 21.

Further, at time t31, the control signal BSTON is also in a raised state. At a time of data erase in the row decoder 10, the control signal BSTON is "H", and the node N0 is set to the potential VDD. As a result, the transfer transistors 12 of the selected block BLKi+1 and the non-selected block BLKi become "on", and the control gate lines CG0-CG31 and the word lines WL_sel and WL_usel are electrically connected.

Additionally at time t31, the control gate lines CG are in a state of being driven at the potential VDD (the pre-charge potential) by the control gate line decoder/drivers 24. Since the control gate lines CG are electrically connected with all of the word lines WL of the selected block BLKi+1 and the non-selected block BLKi, the potential of the word lines WL_sel and WL_usel are both in a state of being raised to the voltage VDD.

In this way, the word lines WL_sel and WL_usel are already held at the potential VDD (the pre-charge potential) prior to commencing execution of the erase operation.

Following this, at time t32, the signal ALL Block Select is caused to fall. As a result, the transfer transistors 12 of the row decoder 10 attached to the non-selected block BLKi are set to an "off" state, and the control gate lines CG and the word lines WL_usel are made to be in a non-conductive state. That is to say, the word lines WL_usel are set to a floating state.

Additionally at time t32, the potential of the control gate lines CG is set to 0V. Even when the signal ALL Block Select has fallen, the block address signal in the row decoder 10 of the selected block BLKi+1 is in an "H" state. As a result, the word lines WL_sel remain electrically connected with the control gate lines CG and is of the same potential, namely 0V, as the control gate lines CG.

Since applied voltages, timing of signals, voltage values, and so on, in the erase operation for time t33 and after are similar to corresponding ones for time t5 and after in the first embodiment, descriptions thereof are omitted.

At time t35, the well potential CPWELL is completely discharged to complete the erase operation and then, at time t36, the signal ALL Block Select is raised. Additionally at time t36, the control gate lines CG are driven to the potential VDD (the pre-charge potential). Since the control gate lines CG are electrically connected with all of the word lines WL of the selected block BLKi+1 and the non-selected block BLKi, the potential of the word lines WL_sel and WL_usel are both raised to the voltage VDD. In this way, the word lines WL_sel and WL_usel are maintained at the potential VDD (the pre-charge potential).

(Effect of the Nonvolatile Semiconductor Memory Device in Accordance with the Fourth Embodiment)

In the NAND flash memory in accordance with the present embodiment, the pre-charge voltage VDD is applied in advance to the word lines WL_usel. Therefore, even if there occurs a voltage drop Vleak caused by the leak current, a potential difference with the well potential Vera is suppressed, as shown in FIG. 10. As a result, a possibility that data stored in the memory cells is accidentally erased can be reduced.

In addition, the NAND flash memory in accordance with the present embodiment enables the erase operation time of data to be extended, similarly to the first embodiment. As a result, there is an increased possibility of being able to erase stored data of a memory cell in one unit cycle of an erase operation, and it becomes possible also to reduce a number of repetitions of the erase operation on the selected block.

In a case of erase of multiple blocks of data in the NAND flash memory, if the word lines of all other non-selected blocks are pre-charged and then discharged to 0V to execute the erase operation, there is a risk that a number of word lines WL to be pre-charged increases and a time required for pre-charging becomes long. However, in the NAND flash memory in accordance with the present embodiment, all the word lines are set to a pre-charge state prior to executing the erase operation. Since the erase operation is subsequently executed by discharging to 0V the word lines of selected blocks only, a time required for pre-charging can be curtailed.

Figure 13:
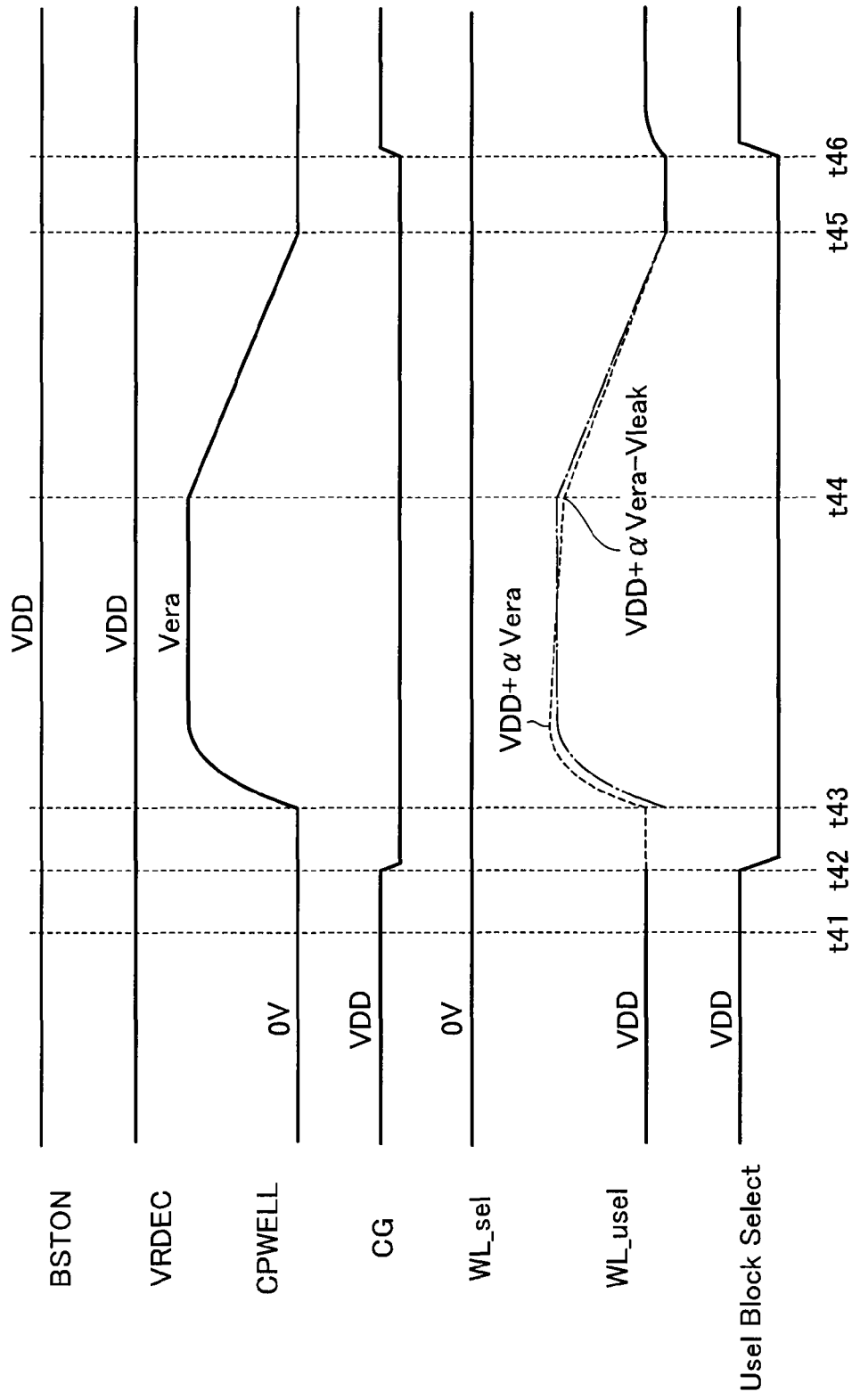
FIG. 13 is a timing chart explaining an erase operation in a NAND flash memory in accordance with another example.

This concludes description of embodiments of the present invention, but it should be noted that the present invention is not limited to the above-described embodiments, and that various alterations, additions, combinations, and so on, are possible within a range not departing from the scope and spirit of the invention. For example, it is also possible to have as word lines WL to which the pre-charge voltage is applied only the word lines WL_usel of the non-selected block BLKi where the erase operation is not to be executed, and to have a configuration in which the pre-charge voltage Vpre is applied in advance to the word lines WL_usel of the non-selected block BLKi, as shown in the timing chart of FIG. 13. That is to say, at time t41, the potential of the word lines WL_usel of the non-selected block BLKi is raised to the voltage VDD and the word lines WL_usel are maintained at the potential VDD (the pre-charge potential) prior to execution of the erase operation being commenced. Following this, at time t42, the word lines WL_usel are set to a floating state, and the erase voltage Vera is applied to the well potential CPWELL to execute the erase operation. In addition, it is also possible to set the initial setting region ROMBLK shown in FIG. 10 as the non-selected block BLKi in this case.

What is claimed is:

1. A nonvolatile semiconductor memory device, comprising:
    a memory cell array configured to have a plurality of blocks arranged thereon, each of said blocks being configured by an assembly of NAND cell units, each of said NAND cell units including a plurality of nonvolatile memory cells connected in series and having a first select gate transistor and a second select gate transistor disposed at respective ends thereof;
    word lines configured to commonly connect control gates of said memory cells aligned in a first direction; and
    a first select gate line and a second select gate line configured to commonly connect gates of said first select gate transistors and said second select gate transistors aligned in said first direction, respectively,
    a data erase operation in said nonvolatile semiconductor memory device being executed by first applying a pre-charge voltage to said word lines, then setting to a floating state said word lines in a non-selected block where erasure of data is not to be executed, applying a certain voltage to said word lines in a selected block where erasure of data is to be executed and applying an erase voltage to a well where said memory cell array is formed, thereby altering a threshold voltage of said memory cells in said selected block.

2. The nonvolatile semiconductor memory device according to claim 1,
    wherein said pre-charge voltage is applied to all of said word lines in said memory cell array.

3. The nonvolatile semiconductor memory device according to claim 1,
    wherein said pre-charge voltage is applied only to said word lines in said non-selected block.

4. The nonvolatile semiconductor memory device according to claim 1,
    wherein said non-selected block is an initial setting region where initial setting data is stored.

5. The nonvolatile semiconductor memory device according to claim 4,
    wherein said data erase operation is configured to erase all of data stored in a region except for said initial setting region.

6. The nonvolatile semiconductor memory device according to claim 1,
    wherein said memory cells are MONOS memory cells.

7. The nonvolatile semiconductor memory device according to claim 1,
    wherein said memory cells are floating gate memory cells.

8. The nonvolatile semiconductor memory device according to claim 1,
    wherein said data erase operation is executed for a certain period of time, and
    wherein a voltage value of said pre-charge voltage is set so that, when said certain period of time has elapsed and a voltage of said word lines in said non-selected block has fallen, said word lines in said non-selected block maintain a voltage value causing no erase operation in said memory cells.

9. A nonvolatile semiconductor memory device, comprising:
    a memory cell array configured to have a plurality of blocks arranged thereon, each of said blocks being configured by an assembly of NAND cell units, each of said NAND cell units including a plurality of nonvolatile memory cells connected in series and having a first select gate transistor and a second select gate transistor disposed at respective ends thereof;
    word lines configured to commonly connect control gates of said memory cells aligned in a first direction, said word lines having a pre-charge voltage applied thereto; and
    a first select gate line and a second select gate line configured to commonly connect gates of said first select gate transistors and said second select gate transistors aligned in said first direction, respectively,
    a data erase operation in said nonvolatile semiconductor memory device being executed by setting to a floating state said word lines in a non-selected block where erasure of data is not to be executed, applying a certain voltage to said word lines in a selected block where erasure of data is to be executed and applying an erase voltage to a well where said memory cell array is formed, thereby altering a threshold voltage of said memory cells in said selected block.

10. The nonvolatile semiconductor memory device according to claim 9,
wherein said non-selected block is an initial setting region where initial setting data is stored.

11. The nonvolatile semiconductor memory device according to claim 10,
wherein said data erase operation is configured to erase all of data stored in a region except for said initial setting region.

12. The nonvolatile semiconductor memory device according to claim 9,
wherein said memory cells are MONOS memory cells.

13. The nonvolatile semiconductor memory device according to claim 9,
wherein said memory cells are floating gate memory cells.

14. The nonvolatile semiconductor memory device according to claim 9,
wherein said data erase operation is executed for a certain period of time, and
wherein a voltage value of said pre-charge voltage is set so that, when said certain period of time has elapsed and a voltage of said word lines in said non-selected block has fallen, said word lines in said non-selected block maintain a voltage value causing no erase operation in said memory cells.

15. A nonvolatile semiconductor memory device, comprising:
a memory cell array configured to have a plurality of blocks arranged thereon, each of said blocks being configured by an assembly of NAND cell units, each of said NAND cell units including a plurality of nonvolatile memory cells connected in series and having a first select gate transistor and a second select gate transistor disposed at respective ends thereof;
word lines configured to commonly connect control gates of said memory cells aligned in a first direction; and
a first select gate line and a second select gate line configured to commonly connect gates of said first select gate transistors and said second select gate transistors aligned in said first direction, respectively,
a pre-charge voltage being previously applied to said word lines in a non-selected block where erasure of data is not to be executed, and
a data erase operation in said nonvolatile semiconductor memory device being executed by setting to a floating state said word lines in said non-selected block, applying a certain voltage to said word lines in a selected block where erasure of data is to be executed and applying an erase voltage to a well where said memory cell array is formed, thereby altering a threshold voltage of said memory cells in said selected block.

16. The nonvolatile semiconductor memory device according to claim 15,
wherein said non-selected block is an initial setting region where initial setting data is stored.

17. The nonvolatile semiconductor memory device according to claim 16,
wherein said data erase operation is configured to erase all of data stored in a region except for said initial setting region.

18. The nonvolatile semiconductor memory device according to claim 15,
wherein said memory cells are MONOS memory cells.

19. The nonvolatile semiconductor memory device according to claim 15,
wherein said memory cells are floating gate memory cells.

20. The nonvolatile semiconductor memory device according to claim 15,
wherein said data erase operation is executed for a certain period of time, and
wherein a voltage value of said pre-charge voltage is set so that, when said certain period of time has elapsed and a voltage of said word lines in said non-selected block has fallen, said word lines in said non-selected block maintain a voltage value causing no erase operation in said memory cells.

* * * * *